United States Patent
Pinier et al.

[11] Patent Number: 6,055,275
[45] Date of Patent: Apr. 25, 2000

[54] ADPCM TRANSCODER

[75] Inventors: François Pinier, Strasbourg; Jean Hoff, St-Jean-Saverne, both of France

[73] Assignee: Alcatel, Paris, France

[21] Appl. No.: 08/941,717

[22] Filed: Sep. 30, 1997

[30] Foreign Application Priority Data

Oct. 7, 1996 [EP] European Pat. Off. .............. 96440078

[51] Int. Cl.[7] .......................... H04B 14/06; H04B 13/02; H03M 7/30
[52] U.S. Cl. .............................. 375/244; 375/222; 341/76
[58] Field of Search ..................... 375/244, 222, 375/242; 370/362, 345; 329/61, 58, 59; 341/76, 53

[56] References Cited

U.S. PATENT DOCUMENTS

| | | | |
|---|---|---|---|
| 4,654,863 | 3/1987 | Belfield et al. | 375/245 |
| 5,334,977 | 8/1994 | Kato | 341/76 |
| 5,384,807 | 1/1995 | Yatim et al. | 375/27 |
| 5,629,976 | 5/1997 | Loke et al. | 379/61 |
| 5,796,731 | 8/1998 | Mellado et al. | 370/362 |

FOREIGN PATENT DOCUMENTS

| | | |
|---|---|---|
| 0497083 | 8/1992 | European Pat. Off. . |
| 0674453 | 9/1995 | European Pat. Off. . |
| 2700903 | 7/1994 | France . |

OTHER PUBLICATIONS

ITU–T Recommendation G. 726–Annex A: "40, 32, 24, 16 kbit/s Adaptive Differential Pulse Code Modulation (ADPCM). Annex A: Extensions of Recommendation G. 726 for Use with Uniform–Quantized Input and Output", Nov. 1994.

ITU–T Recommendation Appendix III (Rec. G. 726) and Appendix II (Rec. G. 727: "Comparison of ADPCM Algorithms", May 1994.

CCITT Recommenation G. 727: 5–, 4–, 3– and 2–bits Sample Embedded Adaptive Differential Pulse Code Modulation (ADPCM). 1990.

*Primary Examiner*—Chi H. Pham
*Assistant Examiner*—Khai Tran

[57] ABSTRACT

Known ADPCM transcoders use processors for coding and decoding, which are time and power consuming. Such a known ADPCM transcoder comprising one processor for coding and decoding can handle four channels, while according to DECT twelve channels need to be available, which requires three known ADPCM transcoders. By delaying signals in an ADPCM transcoder, it is no longer necessary to use processors, but, instead of said processors, logic elements can be used, which is very advantageous, because of such an ADPCM transcoder being able to handle sixteen channels.

9 Claims, 2 Drawing Sheets

ADPCM TRANSCODER

BACKGROUND OF THE INVENTION

1. Technical Field

The present invention relates to an ADPCM transcoder comprising an encoder for a first conversion of a PCM signal originating from a PCM input into an ADPCM signal to be generated via an ADPCM output, and a decoder for a second conversion of an ADPCM signal originating from an ADPCM input into a PCM signal to be generated via a PCM output.

Such an ADPCM transcoder converts signals of different bit rates from one code to another.

2. Discussion of Related Art

ITU-T Recommendation G.727 specifies ADPCM (adaptive differential pulse code modulation) algorithms. The Recommendation defines the principles for transcoding a 64-kb/s PCM (pulse-code-modulated) signal into an ADPCM signal. According to the Recommendation, this can be a 40-, 32-, 24-, or 16-kb/s ADPCM signal (from: CCITT Recommendation G.727, General Aspects of Digital Transmission Systems; Terminal Equipments; 5-, 4-, 3- and 2-Bits Sample Embedded Adaptive Differential Pulse Code Modulation (ADPCM), Geneva, 1990).

Circuits for ADPCM transcoding include one or more processors. By means of such a transcoder, a plurality of channels must be transcoded. In DECT (Digital European Cordless Telephone), for example, 12 channels must be available. Conventional ADPCM transcoding circuits make available a maximum of four channels each. Thus, to make available 12 channels for DECT, for example, at least three transcoding circuits must be provided. This means that at least three different processors (DSPs) are required to make available 12 channels. This results in high power consumption and entails considerable costs.

SUMMARY OF INVENTION

It is an object of the present invention to provide an ADPCM transcoder as described in the preamble which makes available a plurality of channels, works according to predetermined recommendations, and can be implemented at low cost.

The ADPCM transcoder according to the invention is characterized in that the ADPCM transcoder includes delay means for delaying at least one of said conversions.

By allowing said delay of at least one of said conversions, processors are no longer necessary. As a consequence of this, the ADPCM transcoder according to the invention can handle many more channels at the same time.

A first embodiment of the ADPCM transcoder according to the invention is characterized in that at least one signal originating from at least one input (PCMin, ADPCMin) is divided into frames, each frame comprising several time slots, said delaying comprising a delay interval of about a length of one frame.

The length of one frame for example is about 125 msec. corresponding to the 8 kHz sampling frequency.

A second embodiment of the ADPCM transcoder according to the invention is characterized in that the ADPCM transcoder comprises at least one memory coupled to at least one of said coders for temporarily storing at least one signal originating from at least one of said inputs for avoiding overrun due to said delaying.

This second embodiment avoids overrun in a very easy way.

A third embodiment of the ADPCM transcoder according to the invention is characterized in that the ADPCM transcoder comprises a hardware unit comprising at least one of said coders and constructed from logic elements for performing arithmetic functions and logic operations without using instructions.

This third embodiment illustrates several advantages: One advantage of the invention is that, through the use of logic elements instead of a processor, the execution time of an ADPCM algorithm is no longer dependent on the speed of the processor but depends on the execution time per channel. Another advantage is that two or more channels can be processed at a time, so that 16 channels can be made available.

A fourth embodiment of the ADPCM transcoder according to the invention is characterized in that said at least one memory comprises a first memory associated with said encoder and a second memory associated with said decoder.

According to this fourth embodiment the ADPCM transcoder is well organized.

Further advantages are that use can be made of an existing clock signal DCL, which eliminates the need for an external quartz clock source. In addition, such an ADPCM transcoder has low power consumption, the ADPCM transcoder can be used for algorithms specified in Recommendations G.727/G.726, the ADPCM transcoder can be used for code conversion for the standards DECT, PWS and PHS, the ADPCM transcoder can be used for voice compression for voice servers, and a plurality of parallel ADPCM transcoders can be used for providing a pool of channels.

BRIEF DESCRIPTION OF THE DRAWINGS

The invention will become more apparent from the following description of embodiments thereof when taken in conjunction with the accompanying drawings, in which.

DETAILED DESCRIPTION OF THE PREFERRED EMBODIMENTS

Figure 1:
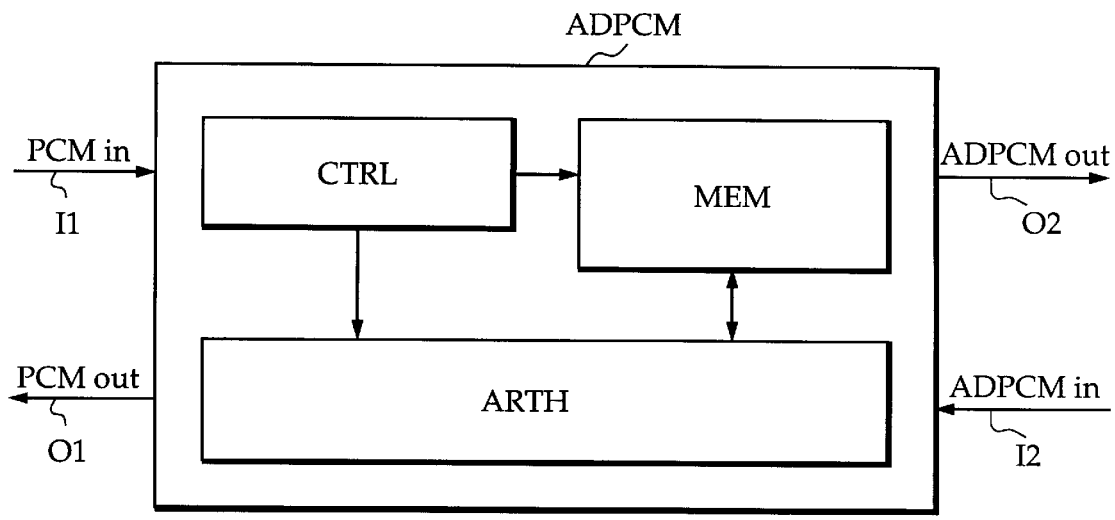
FIG. 1 shows the basic construction of the ADPCM transcoder according to the invention.

FIG. 1 illustrates the fundamental operating principle of the ADPCM transcoder according to the invention. An input I1 of the ADPCM transcoder ADPCM receives a PCM signal. A PCM signal is available from a PCM output O1 of the ADPCM transcoder ADPCM. An output O2 provides an ADPCM signal. Another input of the ADPCM transcoder ADPCM receives an ADPCM signal I2. The ADPCM transcoder ADPCM includes a unit ARTH which is a hardware unit consisting of logic elements for performing arithmetic functions, such as subtraction, addition, multiplication, division, etc., and for performing logic operations, such as comparisons, test operations, etc. Associated with this unit ARTH are a control unit CTRL and a memory MEM. The control unit CTRL controls the ADPCM transcoding. The memory MEM serves to temporarily store data in order to avoid overrun.

Figure 2:
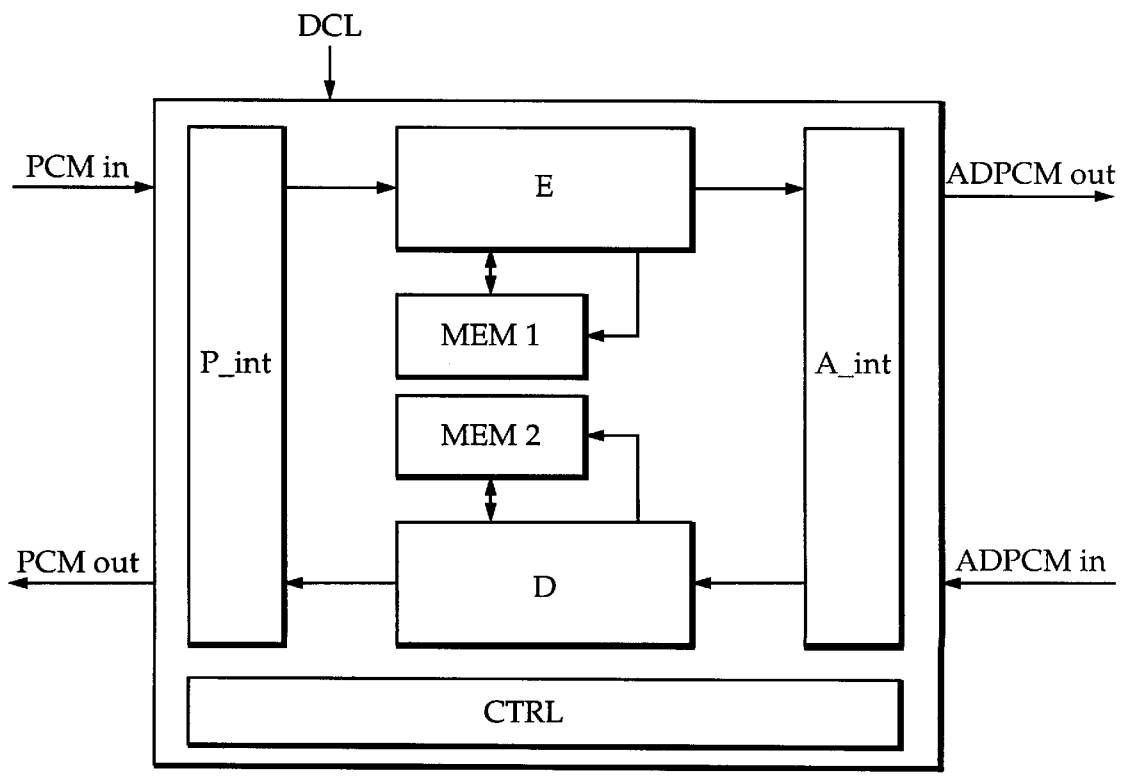
FIG. 2 is a block diagram of the ADPCM transcoder.

FIG. 2 shows a block diagram of the ADPCM transcoder according to the invention. The ADPCM transcoder has a PCM input PCMin and a PCM output PCMout. Associated with this input and output is an interface circuit. P_int which provides an input/output interface. The ADPCM transcoder further has an ADPCM input ADPCMin and an ADPCM output ADPCMout. Associated with the ADPCM input and the ADPCM output is an interface circuit A_int. A PCM signal is applied to the ADPCM transcoder via the PCM input PCMin. The PCM signal is to be transcoded into an ADPCM signal, which is to be provided at the ADPCM output ADPCMout. The PCM signal is received via the interface circuit P_int and output as an ADPCM signal via the interface circuit A_int. Within the ADPCM transcoder, conversion from the PCM format to the ADPCM format must take place. To accomplish this, the ADPCM transcoder includes an encoder E, which is built with logic elements, and a first associated memory MEM1. A PCM signal is fed to the encoder E and is then output via the interface circuit A_int associated with the output ADPCMout. The function of the associated first memory MEM1 will be explained below. The ADPCM transcoder also works in the reverse direction. In that case an ADPCM signal is fed into the ADPCM transcoder via the input ADPCMin and is to be output in PCM-coded form via the PCM output PCMout. The ADPCM signal is received via the interface circuit A_int associated with the ADPCM input ADPCMin. The interface circuit P_int associated with the PCM output PCMout outputs the PCM signal. Within the ADPCM transcoder, the ADPCM signal must be converted to a PCM signal. To accomplish this, a decoder D is provided in the ADPCM transcoder. The decoder D is built with logic elements. Associated with the decoder D is a second memory MEM2 for temporarily storing the data to avoid overrun. The function of the second memory MEM2 will be explained in more detail below. The ADPCM transcoder includes a control unit CTRL which controls the ADPCM transcoding. Such an ADPCM transcoder is suitable for converting a 64-kb/s PCM signal to a 32-kb/s ADPCM signal, for example. The interface circuits P_int, A_int, the encoder E, the decoder D, and the memories MEM1, MEM2 are controlled by a clock signal DCL. This clock signal DCL generally has a frequency of 4.096 MHz and is commonly available as an applied signal, so that no external crystal clock source is required. The logic elements in the encoder E and the decoder D may be logic gates, for example. These serve to implement the ADPCM algorithm, which was mapped onto a time sequence, by means of hardware. Through the use of logic elements instead of a processor, two or more channels can be processed at a time, and the processing of a channel is no longer dependent on the speed of the processor used. Thus, a predetermined number of channels can be made available.

Figure 3:
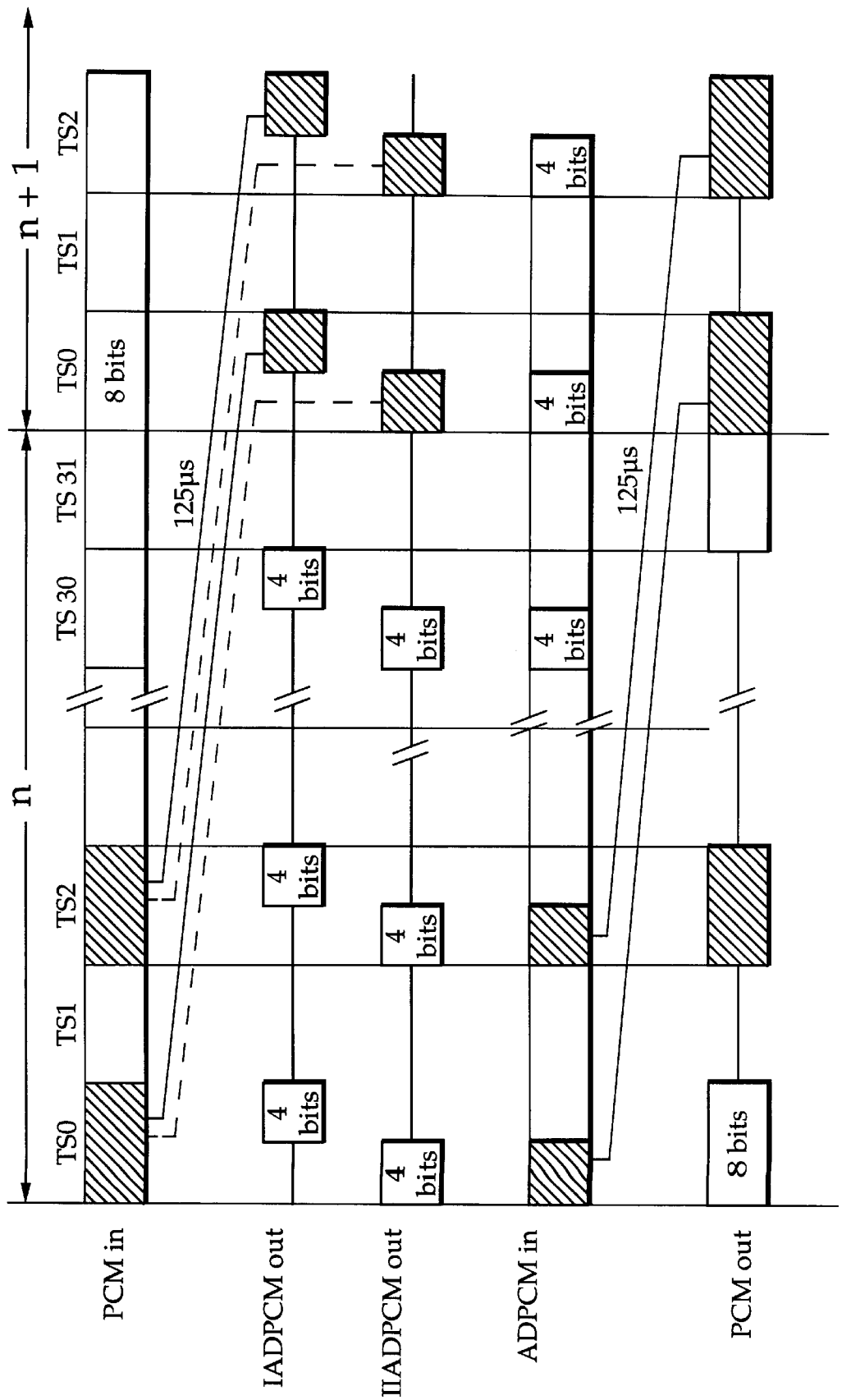
FIG. 3 is a timing diagram of the transcoding.

This will now be explained in more detail with reference to FIG. 3. The timing diagram shows the transcoding of a 64-kb/s PCM signal into a 32-kb/s ADPCM signal. Of a plurality of frames, a first frame n and a second frame n+1 are shown. Each frame contains 32 time slots TS0, TS1, . . . , TS31. Each of the time slots TS0, TS1, . . . , TS31 is 8 bits long. The 8 bits of the first time slot TS0 and the 8 bits of the third time slot TS2 of frame n have been set off (black areas). A PCM signal PCMin entered into the ADPCM transcoder is delayed in the transcoder and appears as an ADPCM signal at the output ADPCMout. This delay is 125 ms, corresponding to the 8 kHz sampling frequency commonly used in telephony. By the transcoding, an 8-bit signal is converted to a 4-bit signal. The PCM signal contained in the first time slot TS0 of the first frame n is mapped onto the time slot TS0 of the second frame n+1. At the ADPCM output ADPCMout, designated here by IADPCMout and IIADPCMout, the 4-bit signal is available in the first portion (continuous line) of the time slot TS0 of frame n+1 and in the second portion (broken line) of this time slot. In the reverse direction, an ADPCM signal is applied to the ADPCM input ADPCMin. The first four bits of the first time slot TS0 and the first four bits of the third time slot TS2 have been set off. They are delayed by 125 ms to a length of 8 bits and transferred to the PCM output PCMout, where they are available in 8-bit format. That is where the memories MEM1 and MEM2 come in, which are associated with the encoder and decoder, respectively. Because of the time delay, here 125 ms, the signals must be temporarily stored to avoid overrun, and this function is performed by the memories MEM1 and MEM2.

In the following, some applications of the ADPCM transcoder according to the invention will be explained. For cordless telecommunications, e.g., for DECT, CT2, or PHS (Japanese standard for cordless telecommunications), a 32-kb/s ADPCM transcoder function is needed, i.e., an ADPCM transcoder must convert incoming 64-kb/s PCM signals to 32-kb/s ADPCM signals. The same takes place in the reverse direction. In DECT, 12 channels must be made available. With the arrangement according to the invention, however, 16 channels can be made available because of the short execution time of the algorithm. This, as explained above, follows from the short computation times and, as illustrated in FIG. 3, from the 32 time slots, where one of every two is used for transmission in one direction and the other for transmission in the reverse direction. As a result, 16 channels are available. In DECT, 12 of these channels are needed, so that four unoccupied channels are available for further applications.

Another application is voice compression in a private branch exchange. Here, a 32-kb/s ADPCM transcoder can convert 30 PCM voice channels into 60 ADPCM voice channels, for example.

A further application is voice compression for voice servers. It is also possible to use a plurality of parallel ADPCM transcoders. In that case, the number of available channels increases according to the offered pool of ADPCM transcoders.

Although the invention has been shown and described with respect to a best mode embodiment thereof, it should be understood by those skilled in the art that the foregoing and various other changes, omissions and additions in the form and detail thereof may be made therein without departing from the spirit and scope of the invention.

We claim:

1. An adaptive differential pulse code modulation (ADPCM) transcoder comprising an encoder (E) for a first conversion of a PCM signal originating from a PCM input (PCMin) into an ADPCM signal to be generated via an ADPCM output (ADPCMout), and a decoder (D) for a second conversion of an ADPCM signal originating from an ADPCM input (ADPCMin) into a PCM signal to be generated via PCM output (PCMout), characterized in that the ADPCM transcoder includes
   delay means for delaying at least one of said conversions, and in that the ADPCM transcoder comprises at least one memory (MEM1, MEM2) coupled to At least one of said encoder and decoder (E, D) for temporarily storing at least one signal originating from at least one of said inputs for avoiding overrun due to said delaying.

2. The ADPCM transcoder as claimed in claim 1, characterized in that at least one signal originating from at least one input (PCMin, ADPCMin) is divided into frames, each frame comprising several time slots, said delaying comprising a delay interval of about a length of one frame.

3. The ADPCM transcoder as claimed in claim 1, characterized in that the ADPCM transcoder includes a hardware unit (ARTH) comprising at least one of said encoder and decoder (E, D) and constructed from logic elements for performing arithmetic functions and logic operations without using instructions.

4. An ADPCM transcoder as claimed in claim 1, characterized in that said at least one memory (MEM1, MEM2) comprises a first memory (MEM1) associated with said encoder (E) and a second memory (MEM2) associated with said decoder (D).

5. An ADPCM transcoder as claimed in claim 4, characterized in that the ADPCM transcoder includes a clock input for receiving a clock signal (DCL) for controlling each coder (E, D) and each memory (MEM1, MEM2).

6. An ADPCM transcoder as claimed in claim 1, characterized in that the ADPCM transcoder is adapted for using algorithms specified in ITU-T Recommendations G.727/G.726.

7. The ADPCM transcoder as claimed in claim 1 for use in code conversion for the standards DECT, PWS and PHS.

8. The ADPCM transcoder as claimed in claim 1 for use in voice compression for voice servers.

9. The plurality of parallel ADPCM transcoders as claimed in claim 1 for use in providing a pool of channels.

* * * * *

UNITED STATES PATENT AND TRADEMARK OFFICE
CERTIFICATE OF CORRECTION

PATENT      :  6,055,275
DATED       :  April 25, 2000
INVENTOR(S) :  Pinier et al It is certified that error appears in the above-identified patent and that said Letters Patent is hereby corrected as shown below:

Title
Page, Item [54], line 1, after "ADPCM", please insert -- (ADAPTIVE DIFFERENTIAL PULSE CODE MODULATION)--.

At col. 1, line 1, after "ADPCM", please insert --(ADAPTIVE DIFFERENTIAL PULSE CODE MODULATION)--.

At col. 4, line 64 (claim 1, line 15), please cancel "At" and substitute --at-- therefor.

Signed and Sealed this

Twentieth Day of March, 2001

Attest:

NICHOLAS P. GODICI

*Attesting Officer*          *Acting Director of the United States Patent and Trademark Office*